(12) United States Patent
Su et al.

(10) Patent No.: US 10,617,026 B2
(45) Date of Patent: Apr. 7, 2020

US010617026B2

(54) ANTI-THEFT CABLE BOX

(71) Applicant: Cheng Uei Precision Industry Co., LTD., New Taipei (TW)

(72) Inventors: Yong-Quan Su, Dong-Guan (CN); Xiao-Li Wang, Dong-Guan (CN); Qing-Hong Lin, Dong-Guan (CN)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/457,894

(22) Filed: Jun. 28, 2019

(65) Prior Publication Data

US 2020/0060030 A1 Feb. 20, 2020

(30) Foreign Application Priority Data

Aug. 14, 2018 (CN) ...................... 2018 2 1310006 U

(51) Int. Cl.
H05K 7/00 (2006.01)
H05K 5/02 (2006.01)
H02G 11/02 (2006.01)
H02G 3/18 (2006.01)
H05K 7/14 (2006.01)

(52) U.S. Cl.
CPC ............ *H05K 5/0217* (2013.01); *H02G 3/18* (2013.01); *H02G 11/02* (2013.01); *H05K 7/1427* (2013.01)

(58) Field of Classification Search
None
See application file for complete search history.

(56) References Cited

U.S. PATENT DOCUMENTS

| 2006/0185062 | A1* | 8/2006 | Peng | H04R 5/0335 |
| | | | | 2/209.13 |
| 2007/0021073 | A1* | 1/2007 | Gratton | H04M 1/05 |
| | | | | 455/90.2 |
| 2008/0143954 | A1* | 6/2008 | Abreu | H04N 7/185 |
| | | | | 351/158 |
| 2011/0213271 | A1* | 9/2011 | Telfort | A61B 7/003 |
| | | | | 600/586 |
| 2016/0277824 | A1* | 9/2016 | Ushakov | H04M 1/05 |
| 2019/0288418 | A1* | 9/2019 | Zhong | H01R 13/6581 |

* cited by examiner

Primary Examiner — Jinhee J Lee
Assistant Examiner — Rashen E Morrison
(74) Attorney, Agent, or Firm — Cheng-Ju Chiang

(57) ABSTRACT

An anti-theft cable box includes a reel module, a conductive ring module, a coil spring module, an external connection module and an outer casing. The reel module includes an upper plate and a lower plate. A bottom surface of the upper plate is spaced from a top surface of the lower plate to form a cable groove between the upper plate and the lower plate. A cable is installed in the cable groove. The conductive ring module is disposed under the reel module, and the reel module is pivotally connected with the conductive ring module. The coil spring module is disposed under the conductive ring module. The external connection module includes an outer shell. The outer shell surrounds the coil spring module. The outer casing covers the reel module, the conductive ring module, the coil spring module and the external connection module.

17 Claims, 10 Drawing Sheets

ANTI-THEFT CABLE BOX

BACKGROUND OF THE INVENTION

1. Field of the Invention

The present invention generally relates to an anti-theft cable box, and more particularly to an anti-theft cable box with a retractable cable and an anti-theft detection function.

2. The Related Art

With continuous innovations of electronic devices, when the electronic devices are sold in a variety of consumer electronics stores, product exhibitions, product display cabinets at fairs, product cabinets of electronic digital shopping malls, mobile phone counters, hypermarkets and other places, consumers often need experience functions of the electronic devices for knowing whether the electronic devices satisfy personal requirements or not, if the electronic devices satisfy the personal requirements in deed, the consumers are willing to purchase, so exhibitions of the electronic devices and consumer experiences of the electronic devices are an important part of sales of the electronic devices, and thus importance of display devices of the electronic devices are shown.

A conventional display device is attached to the electronic device by using a sensing device, and when the electronic device or a part of the electronic device is disengaged from the sensing device, a warning sound is emitted, thereby having a function of notifying a clerk and a function of scaring off thieves to protect the electronic device. The conventional display device is generally a cable box of a display stand.

However, the display device is adhered to the electronic device through a movable block, and the movable block is coupled to a support frame through a magnetic material disposed therein, so that the electronic device can be adsorbed on the support frame when used. When the consumer experiences the electronic device, the electronic device can be freely taken away from the display device for an experience operation. After the experience of the electronic device is over, the electronic device must be returned to the support frame, at the moment, a cable between the electronic device and the support frame is easy to directly fall around the support frame, the display device is made to appear messy due to the cable.

Therefore, it is essential to provide a new-typed anti-theft cable box, the new-typed anti-theft cable box with a retractable cable and an anti-theft detection function, so that a display stand including the new-typed anti-theft cable box can have a cable arrangement effect and an anti-theft effect.

SUMMARY OF THE INVENTION

An object of the present invention is to provide an anti-theft cable box mounted on a display stand of electronic products. The anti-theft cable box includes a reel module, a conductive ring module, a coil spring module, an external connection module and an outer casing. The reel module includes an upper plate, a lower plate and a cable. A middle of the upper plate protrudes downward to form a hollow first barrel portion. A portion of a bottom surface of the hollow first barrel portion is recessed upward to form a first notch. A middle of the hollow first barrel portion has an accommodating space penetrating through the bottom surface of the hollow first barrel portion. A middle of the lower plate opens a circular first connecting hole vertically penetrating through the middle of the lower plate. The hollow first barrel portion of the upper plate is fixed in the first connecting hole. A bottom surface of the upper plate is spaced from a top surface of the lower plate to form a cable groove between the bottom surface of the upper plate and the top surface of the lower plate. The cable is installed in the cable groove. One end of the cable is connected with a connection plug, the other end of the cable is externally connected to an electronic device to be displayed. The conductive ring module is disposed under the reel module, and the reel module is pivotally connected with the conductive ring module. The conductive ring module includes a rotary plate and a first circuit board. A middle of the rotary plate opens a second connecting hole vertically penetrating through the middle of the rotary plate, and the second connecting hole is corresponding to and communicated with the first connecting hole. A top surface of a peripheral wall of the second connecting hole protrudes upward to form a semicircular connection ring. A bottom surface of the peripheral wall of the second connecting hole protrudes downward to form a hollow second barrel portion. A lower portion of a peripheral surface of the hollow second barrel portion is recessed inward to form an accommodating slot. The second connecting hole is equipped with a conductive element. An upper portion of the conductive element is mounted in the first connecting hole and is accommodated in the accommodating space of the upper plate. A top surface of the conductive element is connected with a first wire assembly, and a bottom surface of the conductive element is connected with a second wire assembly. The first circuit board is mounted on the rotary plate. The first circuit board is equipped with a first connector and a receptacle connector. The first wire assembly is connected with the first connector. The receptacle connector is connected with the connection plug. The coil spring module is disposed under the conductive ring module, and is pivotally connected with the hollow second barrel portion of the conductive ring module. The coil spring module includes a hollow upper cover, a rotation shaft, a second bearing, a spring, a circlip and a lower cover. A middle of the upper cover opens a third connecting hole vertically penetrating through the middle of the upper cover. An inner surface of a peripheral wall of the third connecting hole protrudes inward to form a buckling portion. A top of the hollow upper cover opens a restraining hole communicated with an inside of the hollow upper cover. The rotation shaft is installed in the hollow upper cover. An outer peripheral surface of a top portion of the rotation shaft is recessed inward to form a limiting groove. A middle of the rotation shaft opens a fourth connecting hole penetrating through the middle of the rotation shaft along an up-down direction. The hollow second barrel portion passes through the fourth connecting hole. The circlip is mounted in the accommodating slot of the hollow second barrel portion and located at a bottom surface of the rotation shaft. The second bearing is mounted in the limiting groove of the rotation shaft, and the second bearing is mounted in the third connecting hole and is attached to a bottom surface of the buckling portion. The spring is mounted around the rotation shaft. A middle of the lower cover opens a fifth connecting hole corresponding to and communicated with the fourth connecting hole. The lower cover has a ring-shaped lower base sheet. A portion of a top surface of the lower base sheet protrudes upward to form a restricting block corresponding to the restraining hole of the hollow upper cover. A periphery of the top surface of the lower base sheet protrudes upward to form an arc-shaped restricting wall. The restricting block is located between two sides of the restricting wall. The two sides of the restricting wall are spaced from two sides of the restricting block to form two interstices of which each is located between one side of the restricting wall and one side of the restricting block adjacent to the one side of the restricting wall. One end of the spring passes through one interstice, and passes along and is attached to an outer surface of the limiting portion, then enters the other interstice and is attached to an inner surface of the restricting block, so that the one end of the spring is wound around the restricting block, the one end of the spring wraps the restricting block to fasten the one end of the spring to the restricting block, and accordingly the spring has a resilience ability. The hollow upper cover is assembled with the lower cover to form a receiving space between the hollow upper cover and the lower cover. The rotation shaft, the second bearing, the spring and the circlip are received in the receiving space. The external connection module is disposed under the conductive ring module. The coil spring module is disposed in the external connection module. The external connection module includes an outer shell, a second circuit board, a metal ring and an annulus. The outer shell surrounds downward the coil spring module. The outer shell is assembled between the rotary plate of the conductive ring module and the hollow upper cover of the coil spring module. The outer shell covers a top surface of the coil spring module. A middle of the outer shell opens a sixth connecting hole corresponding to and communicated with the fifth connecting hole. The outer shell has a ring-shaped main plate. A periphery of the main plate protrudes downward to form an annular enclosing wall. The enclosing wall opens at least one first opening penetrating through the enclosing wall and communicated with an inside of the outer shell. The second circuit board is of a ring shape. The second circuit board is disposed in the outer shell and located around the hollow upper cover. The second circuit board has at least one connection socket corresponding to the at least one first opening and exposed to the at least one first opening. The second circuit board further has a second connector. The second connector is connected with the second wire assembly. The second connector is connected to the first connector of the first circuit board by the first wire assembly and the second wire assembly of the conductive element. The outer casing covers downward a top surface of the reel module, the conductive ring module, the coil spring module and the external connection module. The outer casing opens a first aperture. An inside of the outer casing is equipped with a rotating shaft disposed adjacent to the first aperture. A free end of the cable projects out from the first aperture of the outer casing. The outer casing opens two second apertures. Each second aperture is corresponding to one first opening of the outer shell. Connection terminals of the two connection sockets are exposed from the two second apertures of the outer casing.

Another object of the present invention is to provide an anti-theft cable box adapted for being connected with an electronic device by a cable. The anti-theft cable box includes a reel module, a conductive ring module, a coil spring module and an external connection module. The reel module includes an upper plate, a lower plate and a cable. A middle of the upper plate protrudes downward to form a hollow first barrel portion. A portion of a bottom surface of the hollow first barrel portion is recessed upward to form a first notch. A middle of the hollow first barrel portion has an accommodating space penetrating through the bottom surface of the hollow first barrel portion. A middle of the lower plate opens a circular first connecting hole vertically penetrating through the middle of the lower plate. The hollow first barrel portion of the upper plate is fixed in the first connecting hole. A bottom surface of the upper plate is spaced from a top surface of the lower plate to form a cable groove between the bottom surface of the upper plate and the top surface of the lower plate. A cable is installed in the cable groove. One end of the cable is connected with a connection plug, the other end of the cable is externally connected to an electronic device to be displayed. The conductive ring module is disposed under the reel module, and the reel module is pivotally connected with the conductive ring module. The conductive ring module includes a rotary plate and a first circuit board. A middle of the rotary plate opens a second connecting hole vertically penetrating through the middle of the rotary plate, and the second connecting hole is corresponding to and communicated with the first connecting hole. A top surface of a peripheral wall of the second connecting hole protrudes upward to form a semicircular connection ring. A bottom surface of the peripheral wall of the second connecting hole protrudes downward to form a hollow second barrel portion. A lower portion of a peripheral surface of the hollow second barrel portion is recessed inward to form an accommodating slot. The second connecting hole is equipped with a conductive element. An upper portion of the conductive element is mounted in the first connecting hole and is accommodated in the accommodating space of the upper plate. A top surface of the conductive element is connected with a first wire assembly, and a bottom surface of the conductive element is connected with a second wire assembly. The first circuit board is mounted on the rotary plate. The first circuit board is equipped with a first connector and a receptacle connector. The first wire assembly is connected with the first connector. The receptacle connector is connected with the connection plug. The coil spring module is disposed under the conductive ring module, and is pivotally connected with the hollow second barrel portion of the conductive ring module. The coil spring module includes a hollow upper cover, a rotation shaft, a second bearing, a spring, a circlip and a lower cover. A middle of the upper cover opens a third connecting hole vertically penetrating through the middle of the upper cover. An inner surface of a peripheral wall of the third connecting hole protrudes inward to form a buckling portion. A top of the hollow upper cover opens a restraining hole communicated with an inside of the hollow upper cover. The rotation shaft is installed in the hollow upper cover. An outer peripheral surface of a top portion of the rotation shaft is recessed inward to form a limiting groove. A middle of the rotation shaft opens a fourth connecting hole penetrating through the middle of the rotation shaft along an up-down direction. The hollow second barrel portion passes through the fourth connecting hole. The circlip is mounted in the accommodating slot of the hollow second barrel portion and located at a bottom surface of the rotation shaft. The second bearing is mounted in the limiting groove of the rotation shaft, and the second bearing is mounted in the third connecting hole and is attached to a bottom surface of the buckling portion. The spring is mounted around the rotation shaft. A middle of the lower cover opens a fifth connecting hole corresponding to and communicated with the fourth connecting hole. The lower cover has a ring-shaped lower base sheet. A portion of a top surface of the lower base sheet protrudes upward to form a restricting block corresponding to the restraining hole of the hollow upper cover. A periphery of the top surface of the lower base sheet protrudes upward to form an arc-shaped restricting wall. The restricting block is located between two sides of the restricting wall. The two sides of the restricting wall are spaced from two sides of the restricting block to form two interstices of which each is located between one side of the restricting wall and one side of the restricting block adjacent to the one side of the restricting wall. One end of the spring passes through one interstice, and passes along and is attached to an outer surface of the limiting portion, then enters the other interstice and is attached to an inner surface of the restricting block, so that the one end of the spring is wound around the restricting block, the one end of the spring wraps the restricting block to fasten the one end of the spring to the restricting block, and accordingly the spring has a resilience ability. The hollow upper cover is assembled with the lower cover to form a receiving space between the hollow upper cover and the lower cover. The rotation shaft, the second bearing, the spring and the circlip are received in the receiving space. The external connection module is disposed under the conductive ring module. The coil spring module is disposed in the external connection module. The external connection module includes an outer shell, a second circuit board, a metal ring and an annulus. The outer shell surrounds downward the coil spring module. The outer shell is assembled between the rotary plate of the conductive ring module and the hollow upper cover of the coil spring module. The outer shell covers a top surface of the coil spring module. A middle of the outer shell opens a sixth connecting hole corresponding to and communicated with the fifth connecting hole. The outer shell has a ring-shaped main plate. A periphery of the main plate protrudes downward to form an annular enclosing wall. The enclosing wall opens at least one first opening penetrating through the enclosing wall and communicated with an inside of the outer shell. The second circuit board is of a ring shape. The second circuit board is disposed in the outer shell and located around the hollow upper cover. The second circuit board has at least one connection socket corresponding to the at least one first opening and exposed to the at least one first opening. The second circuit board further has a second connector. The second connector is connected with the second wire assembly. The second connector is connected to the first connector of the first circuit board by the first wire assembly and the second wire assembly of the conductive element.

Another object of the present invention is to provide an anti-theft cable box. The anti-theft cable box includes a reel module, a conductive ring module, a coil spring module and an external connection module. The reel module includes an upper plate, a lower plate and a cable. A middle of the upper plate protrudes downward to form a hollow first barrel portion. A portion of a bottom surface of the hollow first barrel portion is recessed upward to form a first notch. A middle of the hollow first barrel portion has an accommodating space penetrating through the bottom surface of the hollow first barrel portion. A middle of the lower plate opens a circular first connecting hole vertically penetrating through the middle of the lower plate. The hollow first barrel portion of the upper plate is fixed in the first connecting hole. A bottom surface of the upper plate is spaced from a top surface of the lower plate to form a cable groove between the bottom surface of the upper plate and the top surface of the lower plate. A cable is installed in the cable groove. The cable is connected between the anti-theft cable box and the electronic device. The conductive ring module is disposed under the reel module, and the reel module is pivotally connected with the conductive ring module. The conductive ring module includes a rotary plate and a first circuit board. A middle of the rotary plate opens a second connecting hole vertically penetrating through the middle of the rotary plate, and the second connecting hole is corresponding to and communicated with the first connecting hole. A top surface of a peripheral wall of the second connecting hole protrudes upward to form a semicircular connection ring. A bottom surface of the peripheral wall of the second connecting hole protrudes downward to form a hollow second barrel portion. A lower portion of a peripheral surface of the hollow second barrel portion is recessed inward to form an accommodating slot. The second connecting hole is equipped with a conductive element. An upper portion of the conductive element is mounted in the first connecting hole and is accommodated in the accommodating space of the upper plate. A top surface of the conductive element is connected with a first wire assembly, and a bottom surface of the conductive element is connected with a second wire assembly. The first circuit board is mounted on the rotary plate. The first circuit board is equipped with a first connector. The first wire assembly is connected with the first connector. The coil spring module is disposed under the conductive ring module, and is pivotally connected with the hollow second barrel portion of the conductive ring module. The coil spring module includes a hollow upper cover, a rotation shaft, a second bearing, a spring, a circlip and a lower cover. A middle of the upper cover opens a third connecting hole vertically penetrating through the middle of the upper cover. An inner surface of a peripheral wall of the third connecting hole protrudes inward to form a buckling portion. A top of the hollow upper cover opens a restraining hole communicated with an inside of the hollow upper cover. The rotation shaft is installed in the hollow upper cover. An outer peripheral surface of a top portion of the rotation shaft is recessed inward to form a limiting groove. A middle of the rotation shaft opens a fourth connecting hole penetrating through the middle of the rotation shaft along an up-down direction. The hollow second barrel portion passes through the fourth connecting hole. The circlip is mounted in the accommodating slot of the hollow second barrel portion and located at a bottom surface of the rotation shaft. The second bearing is mounted in the limiting groove of the rotation shaft, and the second bearing is mounted in the third connecting hole and is attached to a bottom surface of the buckling portion. The spring is mounted around the rotation shaft. A middle of the lower cover opens a fifth connecting hole corresponding to and communicated with the fourth connecting hole. The lower cover has a ring-shaped lower base sheet. A portion of a top surface of the lower base sheet protrudes upward to form a restricting block corresponding to the restraining hole of the hollow upper cover. A periphery of the top surface of the lower base sheet protrudes upward to form an arc-shaped restricting wall. The restricting block is located between two sides of the restricting wall. The two sides of the restricting wall are spaced from two sides of the restricting block to form two interstices of which each is located between one side of the restricting wall and one side of the restricting block adjacent to the one side of the restricting wall. One end of the spring passes through one interstice, and passes along and is attached to an outer surface of the limiting portion, then enters the other interstice and is attached to an inner surface of the restricting block, so that the one end of the spring is wound around the restricting block, the one end of the spring wraps the restricting block to fasten the one end of the spring to the restricting block, and accordingly the spring has a resilience ability. The hollow upper cover is assembled with the lower cover to form a receiving space between the hollow upper cover and the lower cover. The rotation shaft, the second bearing, the spring and the circlip are received in the receiving space. The external connection module is disposed under the conductive ring module. The coil spring module is disposed in the external connection module. The external connection module includes an outer shell, a second circuit board, a metal ring and an annulus. The outer shell surrounds downward the coil spring module. The outer shell is assembled between the rotary plate of the conductive ring module and the hollow upper cover of the coil spring module. The outer shell covers a top surface of the coil spring module. A middle of the outer shell opens a sixth connecting hole corresponding to and communicated with the fifth connecting hole. The outer shell has a ring-shaped main plate. A periphery of the main plate protrudes downward to form an annular enclosing wall. The enclosing wall opens at least one first opening penetrating through the enclosing wall and communicated with an inside of the outer shell. The second circuit board is of a ring shape. The second circuit board is disposed in the outer shell and located around the hollow upper cover. The second circuit board has at least one connection socket corresponding to the at least one first opening and exposed to the at least one first opening. The second circuit board further has a second connector. The second connector is connected with the second wire assembly. The second connector is connected to the first connector of the first circuit board by the first wire assembly and the second wire assembly of the conductive element.

As described above, the cable of the anti-theft cable box has a stretchable and retractable property and a function of winding up the cable automatically by virtue of a cooperation of the reel module and the coil spring module, when a salesperson displays the electronic product or a customer experiences the electronic product, the electronic product can be taken away from the display stand to display the electronic product more freely or experience the electronic product more freely by virtue of the stretchable property of the cable, and the cable is returned to an original position by the salesperson or the customer without needing to arrange the retractable cable by virtue of the function of winding up the cable, so time of arranging the cable manually is saved. Furthermore, if somebody takes away the cable on the display stand privately, the conductive ring module set up in the anti-theft cable box may detect and trigger an anti-theft system speaker to inform workers on-the-spot for reaching an anti-theft detection function. Thus, the anti-theft cable box may not only help the salesperson display the electronic product, but also help the customer experience the electronic product so as to facilitate selling the electronic product and making the anti-theft cable box have the anti-theft detection function to protect the electronic products during a period of the customer experiencing the electronic products. As a result, the display stand including the anti-theft cable box can have a cable arrangement effect and an anti-theft effect.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 1:
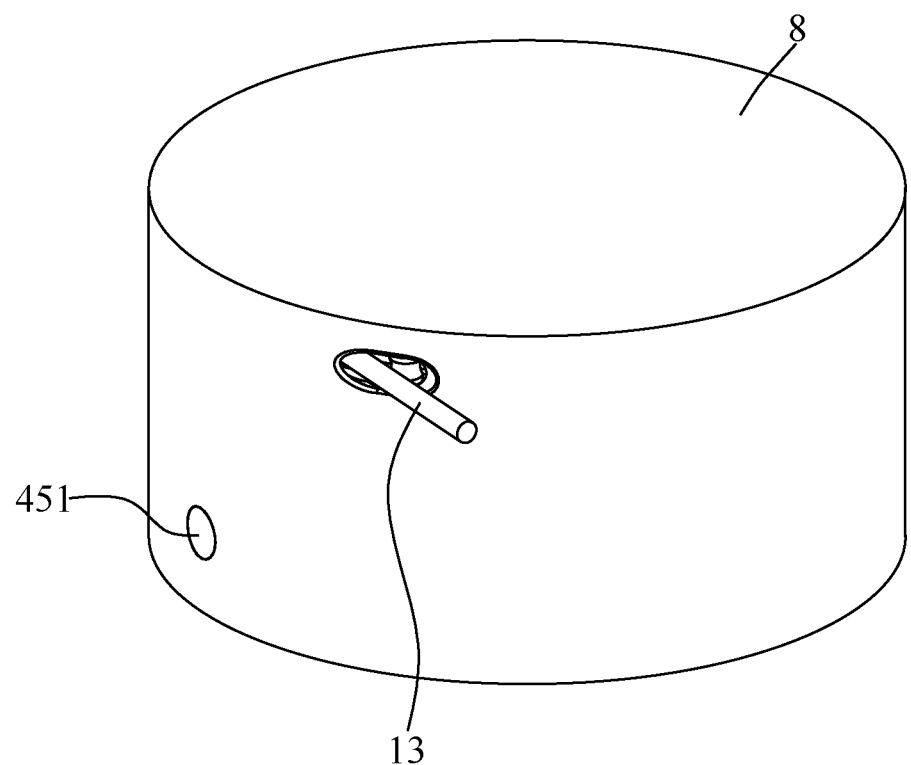
FIG. 1 is a perspective view of an anti-theft cable box in accordance with the present invention.
Figure 2:
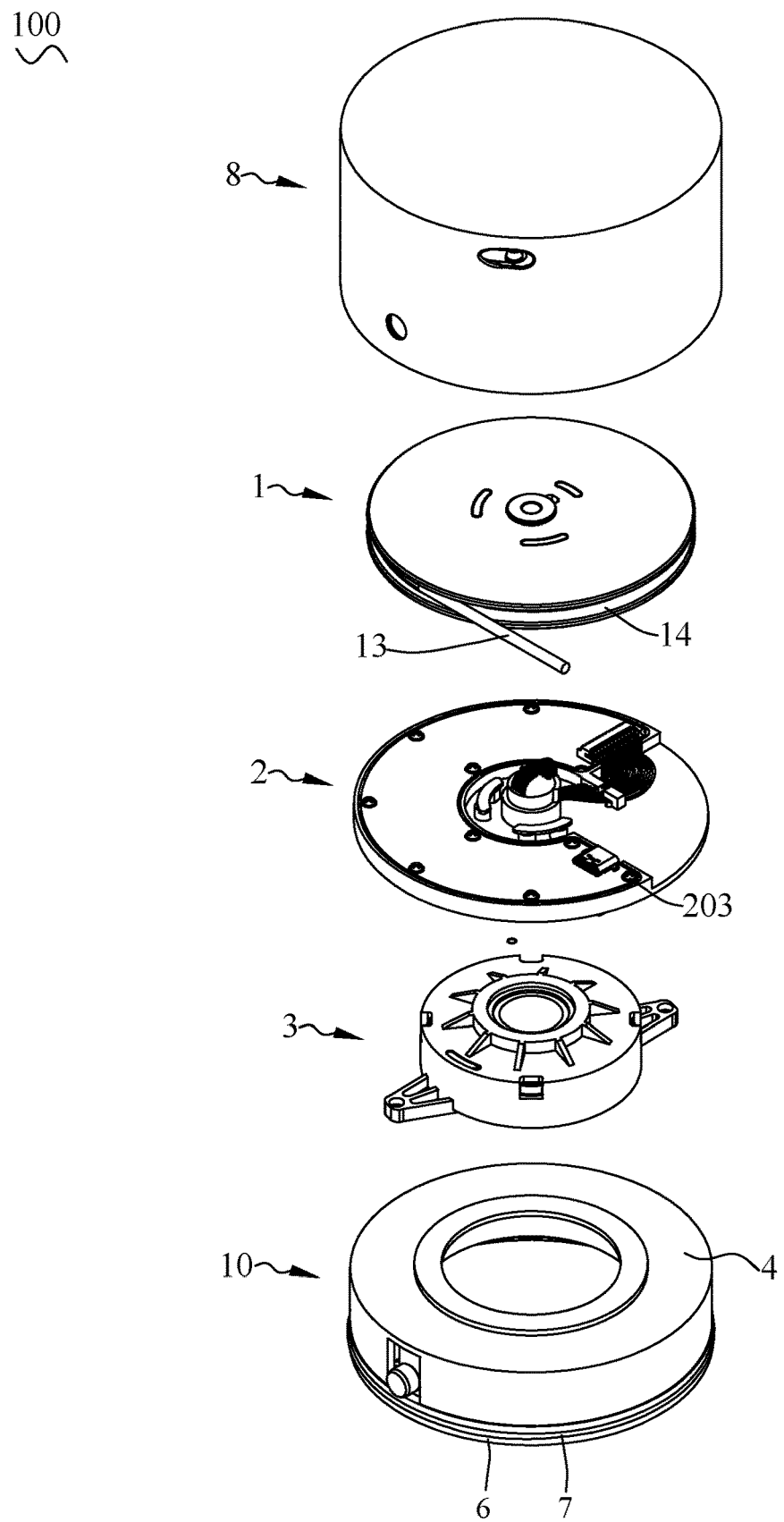
FIG. 2 is an exploded perspective view of the anti-theft cable box in accordance with the present invention.

With reference to FIG. 1 and FIG. 2, an anti-theft cable box 100 in accordance with the present invention is shown. The anti-theft cable box 100 is mounted on a display stand of electronic products (not shown). The anti-theft cable box 100 is adapted for being connected with an electronic device (not shown) by a cable 13. The anti-theft cable box 100 includes a reel module 1, a conductive ring module 2, a coil spring module 3, an external connection module 10 and an outer casing 8.

Figure 3:
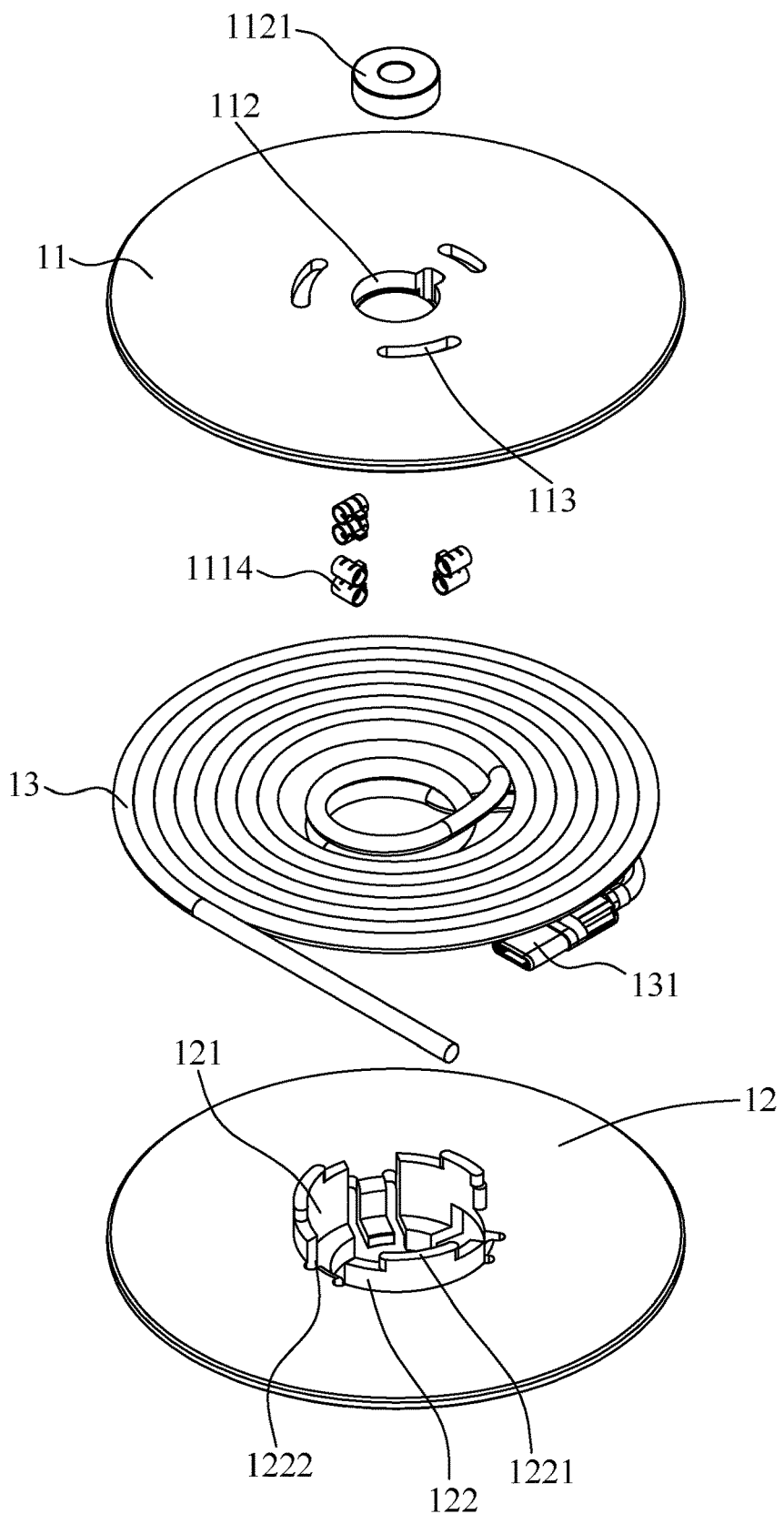
FIG. 3 is an exploded perspective view of a reel module of the anti-theft cable box in accordance with the present invention.
Figure 4:
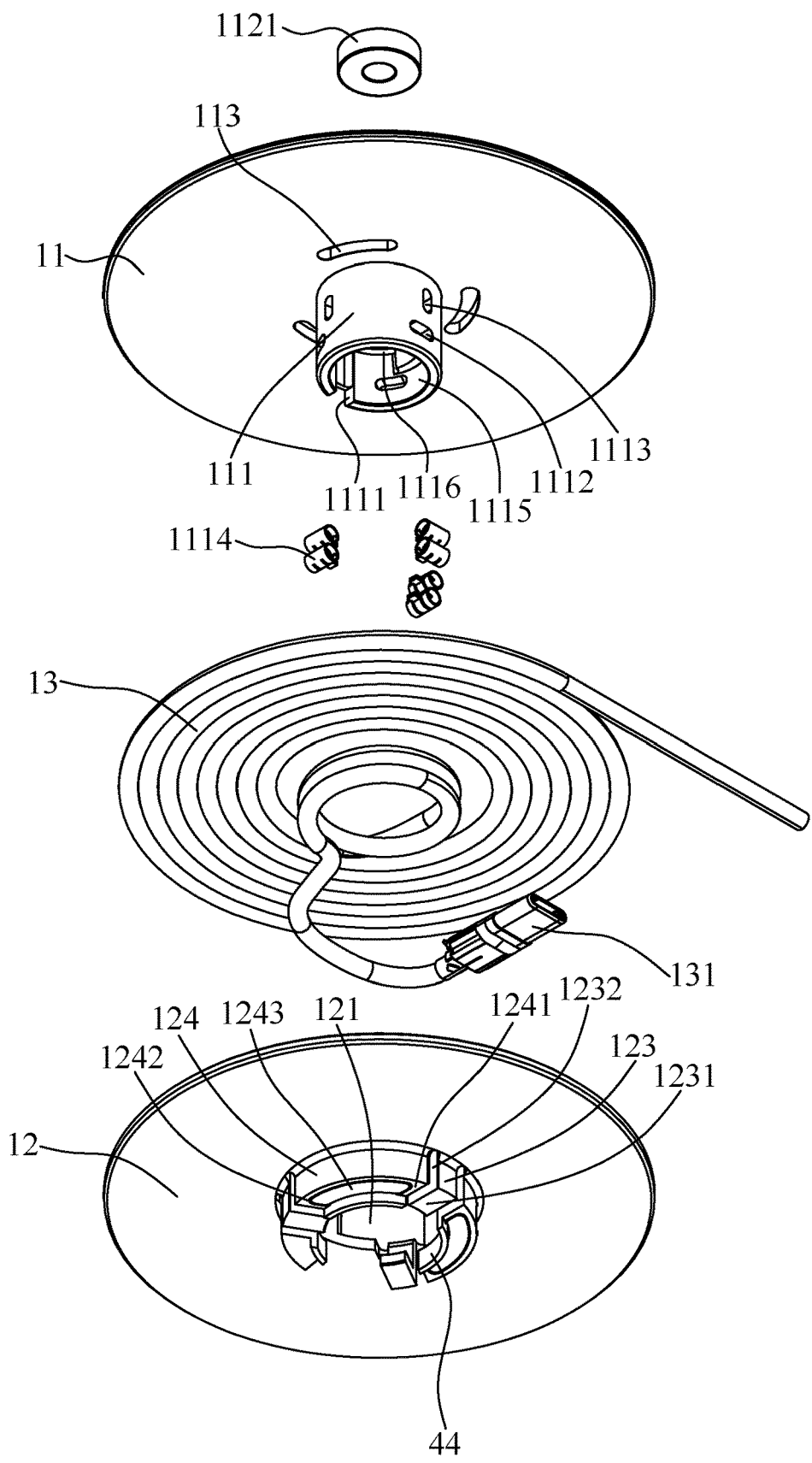
FIG. 4 is another exploded perspective view of the reel module of the anti-theft cable box of FIG. 3.

With reference to FIG. 2 to FIG. 4, the reel module 1 includes an upper plate 11, a lower plate 12 and the retractable cable 13. A middle of the upper plate 11 protrudes downward to form a hollow first barrel portion 111. A portion of a bottom surface of the hollow first barrel portion 111 is recessed upward to form a first notch 1111. A periphery of the hollow first barrel portion 111 has at least one locking hole 1112 communicated with a middle of the hollow first barrel portion 111. In this embodiment, the periphery of the hollow first barrel portion 111 has three locking holes 1112. The periphery of the hollow first barrel portion 111 has at least one fastening slot 1113. Each fastening slot 1113 is equipped with a pair of cable clips 1114. In this embodiment, the three fastening slots 1113 are equipped with six cable clips 1114.

The middle of the hollow first barrel portion 111 has an accommodating space 1115 penetrating through the bottom surface of the hollow first barrel portion 111. One side of a bottom of an inner wall of the accommodating space 1115 of the upper plate 11 is recessed upward to form a buckling slot 1116. A middle of a top surface of the upper plate 11 is recessed downward to form a circular holding slot 112. The holding slot 112 is equipped with a first bearing 1121. The upper plate 11 opens at least one arc-shaped limiting slot 113 adjacent to and spaced from the holding slot 112. A middle of the at least one arc-shaped limiting slot 113 is arched outward away from the holding slot 112. In this embodiment, the upper plate 11 opens three arc-shaped limiting slots 113 around the holding slot 112.

The upper plate 11 is mounted on the lower plate 12. A middle of the lower plate 12 opens a circular first connecting hole 121 vertically penetrating through the middle of the lower plate 12. The hollow first barrel portion 111 of the upper plate 11 is fixed in the first connecting hole 121. At least one portion of a top surface of a peripheral wall of the first connecting hole 121 protrudes upward to form at least one arc-shaped first blocking wall 122 arched outward away from the first connecting hole 121. A top surface of the at least one first blocking wall 122 protrudes upward to form an arc-shaped limiting portion 1221. The limiting portion 1221 of the at least one first blocking wall 122 is corresponding to and limited in the at least one limiting slot 113.

In this embodiment, three portions of the top surface of the peripheral wall of the first connecting hole 121 protrude upward to form three first blocking walls 122 corresponding to and assembled in the three limiting slots 113. A gap 1222 is formed between each two adjacent first blocking walls 122. At least one portion of a bottom surface of the peripheral wall of the first connecting hole 121 protrudes downward to form at least one second blocking wall 123. A bottom of the at least one second blocking wall 123 protrudes inward to form a fastening block 1231 corresponding to and fastened in the at least one locking hole 1112. Three portions of the bottom surface of the peripheral wall of the first connecting hole 121 protrude downward to form three second blocking walls 123. Bottoms of the three second blocking walls 123 protrude inward to form three fastening blocks 1231 corresponding to and fastened in the three locking holes 1112.

At least one portion of the bottom surface of the peripheral wall of the first connecting hole 121 protrudes downward to form at least one third blocking wall 124. In this embodiment, three portions of the bottom surface of the peripheral wall of the first connecting hole 121 protrude downward to form three third blocking walls 124. Each third blocking wall 124 is interposed between two adjacent second blocking walls 123. An interval 1232 is formed between one third blocking wall 124 and one second blocking wall 123 which are spaced and away from each other. A bottom of each third blocking wall 124 protrudes inward to form an arc-shaped abutting block 1241 arched outward away from the first connecting hole 121. An inner wall of the abutting block 1241 of each third blocking wall 124 abuts against an outer surface of the hollow first barrel portion 111. Bottom surfaces of two abutting blocks 1241 of two third blocking walls 124 are recessed upward to form two blocking slots 1242. Each blocking slot 1242 is equipped with a metal plate 1243. In this embodiment, the metal plate 1243 is an iron piece.

The at least one first blocking wall 122 is located between a bottom surface of the upper plate 11 and a top surface of the lower plate 12, so the bottom surface of the upper plate 11 is spaced from the top surface of the lower plate 12 to form a cable groove 14 between the bottom surface of the upper plate 11 and the top surface of the lower plate 12. The cable 13 is installed in the cable groove 14. Specifically, each cable clip 1114 clamps the cable 13 and each pair of the cable clips 1114 are fixed in one fastening slot 1113, so that the cable 13 is fixed in the cable groove 14. One end of the cable 13 is connected with a connection plug 131.

Specifically, the connection plug 131 is a USB (Universal Serial Bus) type-c connector. The one end of the cable 13 and the USB type-c connector are exposed to a bottom surface of the lower plate 12 and the cable 13 passes through the interval 1232. The cable 13 is rolled upward along a lower portion of the first connecting hole 121 and extends out of an upper portion of the first connecting hole 121. The cable 13 passes through one gap 1222 of two of the first blocking walls 122 and is rolled around the at least one first blocking wall 122 on the top surface of the lower plate 12 to show a spiral shape. The other end of the cable 13 is connected with an external plug (not shown) connected to the electronic device to be displayed. The other end of the cable 13 is externally connected to an electronic device to be displayed. So the cable 13 is connected between the anti-theft cable box 100 and the electronic device.

Figure 5:
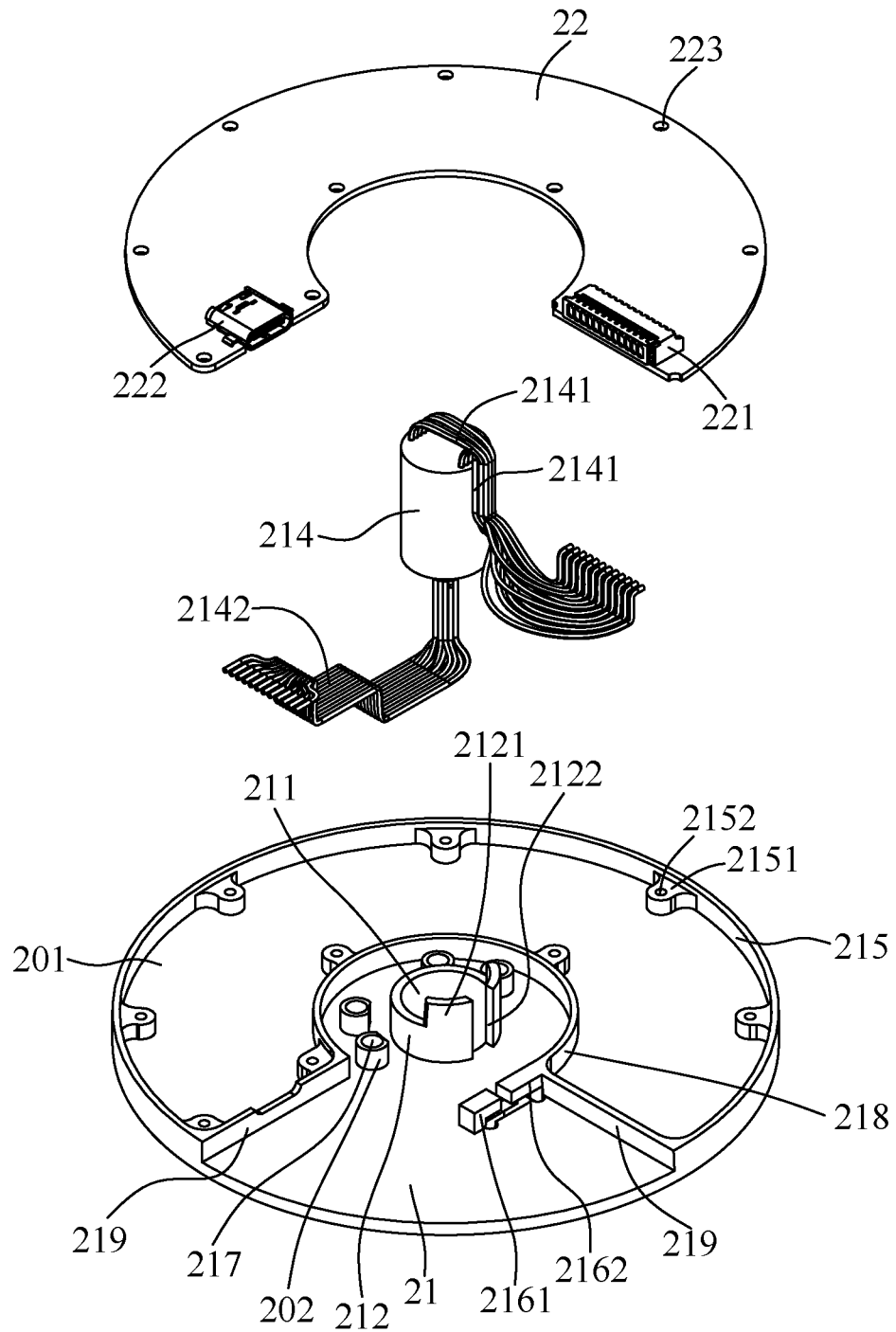
FIG. 5 is an exploded perspective view of a conductive ring module of the anti-theft cable box in accordance with the present invention.
Figure 6:
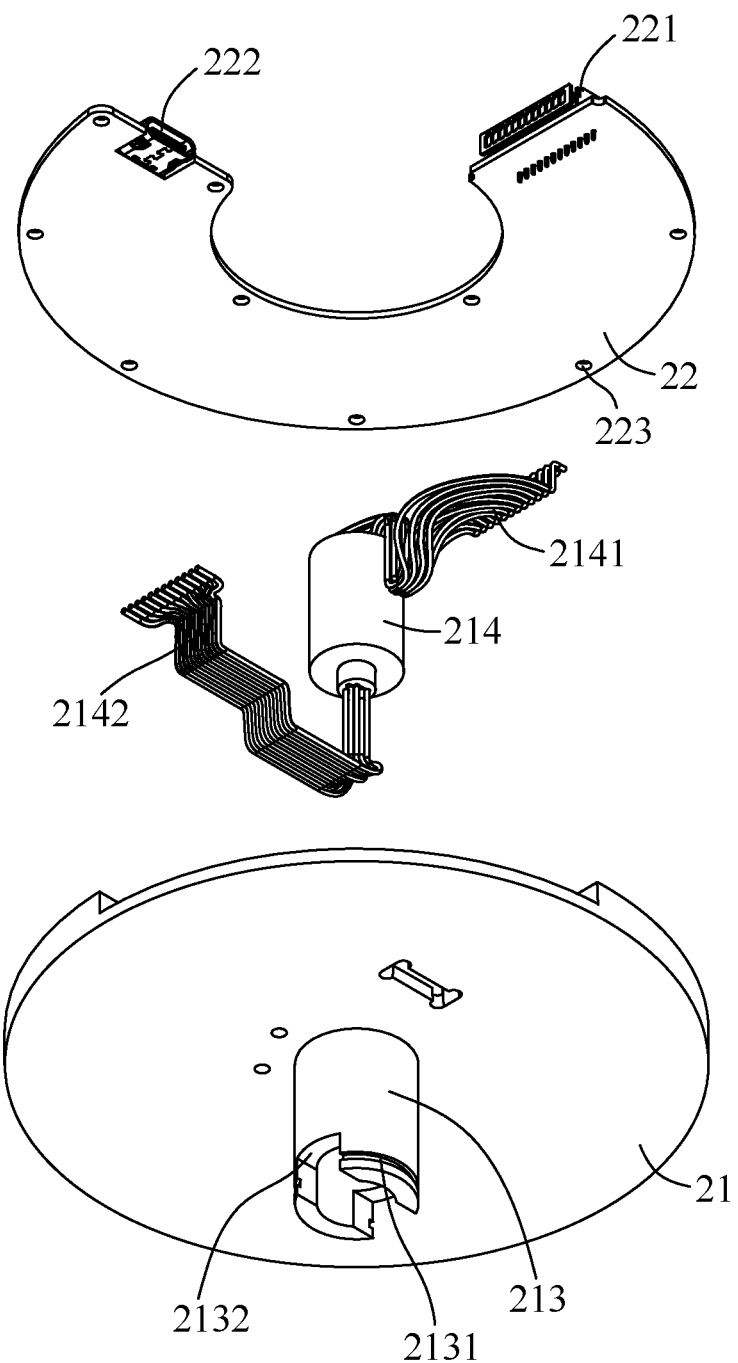
FIG. 6 is another exploded perspective view of the conductive ring module of the anti-theft cable box of FIG. 5.

With reference to FIG. 2, FIG. 5 and FIG. 6, the conductive ring module 2 is disposed under the reel module 1, and the reel module 1 is pivotally connected with the conductive ring module 2. The conductive ring module 2 includes a rotary plate 21 and a first circuit board 22. A middle of the rotary plate 21 opens a second connecting hole 211 vertically penetrating through the middle of the rotary plate 21, and the second connecting hole 211 is corresponding to and communicated with the first connecting hole 121. A top surface of a peripheral wall of the second connecting hole 211 protrudes upward to form a semicircular connection ring 212. Two opposite sides of a top surface of the connection ring 212 extend upward to form two buckling slices 2121, and the two buckling slices 2121 are mounted in the buckling slot 1116 of the upper plate 11.

One side of the connection ring 212 is opened freely to form a lacking groove 2122. A bottom surface of the peripheral wall of the second connecting hole 211 protrudes downward to form a hollow second barrel portion 213. A lower portion of a peripheral surface of the hollow second barrel portion 213 is recessed inward to form an accommodating slot 2131. At least one side of a bottom surface of the hollow second barrel portion 213 is recessed upward to form at least one second notch 2132. In this embodiment, two sides of the bottom surface of the hollow second barrel portion 213 are recessed upward to form two second notches 2132. The second connecting hole 211 is equipped with a conductive element 214 of a cylinder shape. An upper portion of the conductive element 214 is mounted in the first connecting hole 121 and is accommodated in the accommodating space 1115 of the upper plate 11. A top surface of the conductive element 214 is connected with a first wire assembly 2141, and a bottom surface of the conductive element 214 is connected with a second wire assembly 2142.

A periphery of a top surface of the rotary plate 21 protrudes upward and is arched outward to form an arc-shaped outer stopping wall 215. A middle of the top surface of the rotary plate 21 protrudes upward and is arched outward to form an arc-shaped inner stopping wall 218 corresponding to and spaced from an inner side of the outer stopping wall 215. Two sides of the top surface of the rotary plate 21 protrude upward to form two connecting walls 219. One connecting wall 219 is connected between free ends of one end of the outer stopping wall 215 and one end of the inner stopping wall 218. The other connecting wall 219 is connected between free ends of the other end of the outer stopping wall 215 and the other end of the inner stopping wall 218. An accommodating groove 201 is formed among the outer stopping wall 215, the inner stopping wall 218 and the two connecting walls 219.

The accommodating groove 201 is matched with the first circuit board 22. Several portions of an inner surface of the outer stopping wall 215 and an outer surface of the inner stopping wall 218 protrude into the accommodating groove 201 to form a plurality of protruding blocks 2151. Each protruding block 2151 opens a lower fixing hole 2152. A portion of the top surface of the rotary plate 21 protrudes upward and then protrudes towards the free end of the one end of the inner stopping wall 218 to form a first clamping portion 2161 of which a tail end facing the inner stopping wall 218 is spaced from the top surface of the rotary plate 21. An upper portion of the free end of the one end of the inner stopping wall 218 protrudes towards the first clamping portion 2161 to form a second clamping portion 2162 spaced from the top surface of the rotary plate 21.

The connection ring 212 is half surrounded by the inner stopping wall 218. At least one portion of the top surface of the rotary plate 21 protrudes upward to form at least one fastening tube 202. The at least one fastening tube 202 is equipped with at least one magnet 217. The at least one magnet 217 is corresponding to the metal plate 1243. The magnet 217 is able to attract the metal plate 1243. So, when the cable 13 needs to be replaced, the upper plate 11 is removed, and then the metal plate 1243 is attracted by the magnet 217, so that the lower plate 12 is fixed on the rotary plate 21, and the cable 13 is capable of being directly replaced. The first circuit board 22 is mounted on the rotary plate 21 and is received in the accommodating groove 201.

The first circuit board 22 is equipped with a first connector 221 and a receptacle connector 222. The first wire assembly 2141 is connected with the first connector 221 by virtue of passing through the lacking groove 2122 of the connection ring 212 and passing through a place under the first clamping portion 2161 and the second clamping portion 2162. The receptacle connector 222 is connected with the connection plug 131 of the cable 13. The first circuit board 22 has a plurality of location holes 223 corresponding to and communicated with the plurality of the lower fixing holes 2152 of the plurality of the protruding blocks 2151. A plurality of fixing elements 203 pass through the plurality of the location holes 223 and the plurality of the lower fixing holes 2152 corresponding to and communicated with the plurality of the location holes 223, so the first circuit board 22 is fixed on the rotary plate 21. In this embodiment, the fixing element 203 is a screw.

Figure 7:
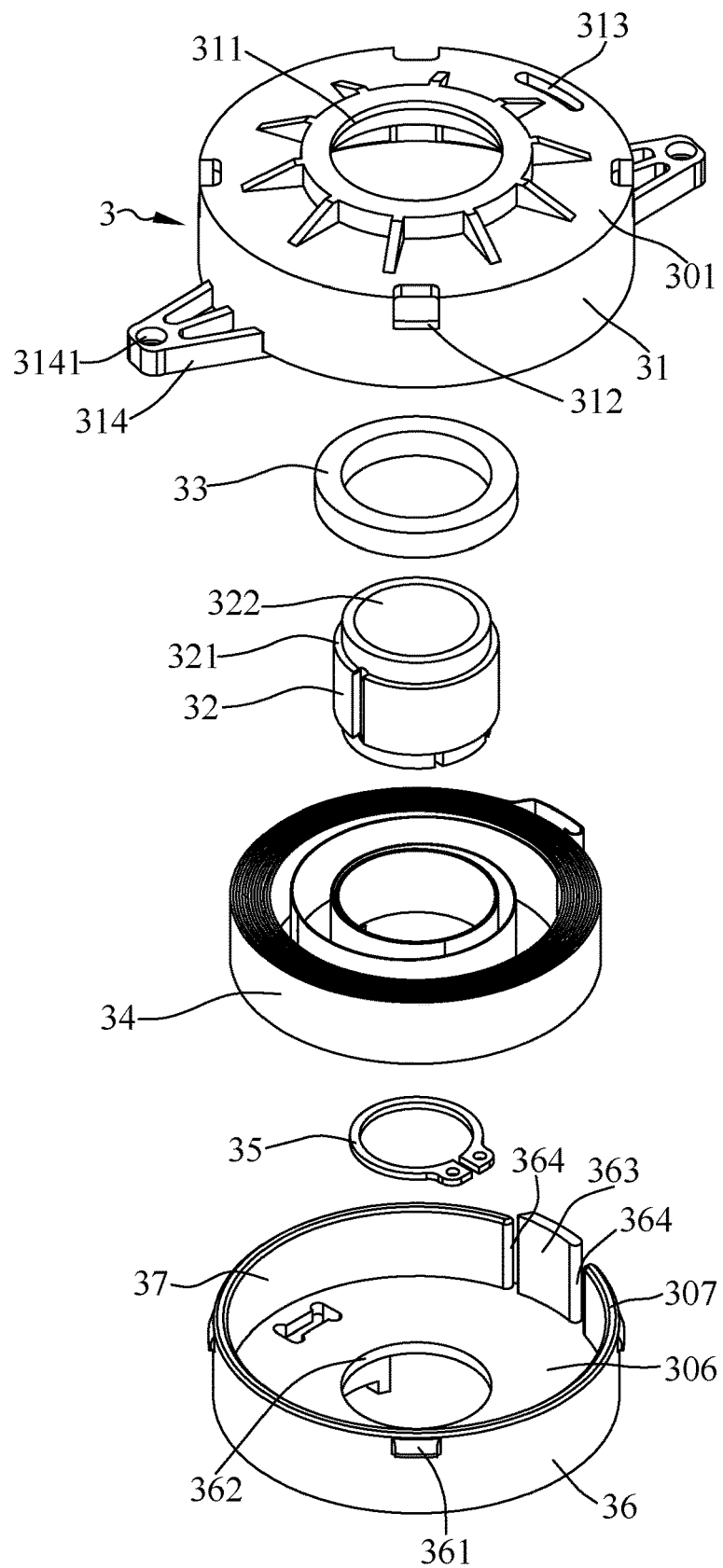
FIG. 7 is an exploded perspective view of a coil spring module of the anti-theft cable box in accordance with the present invention.
Figure 8:
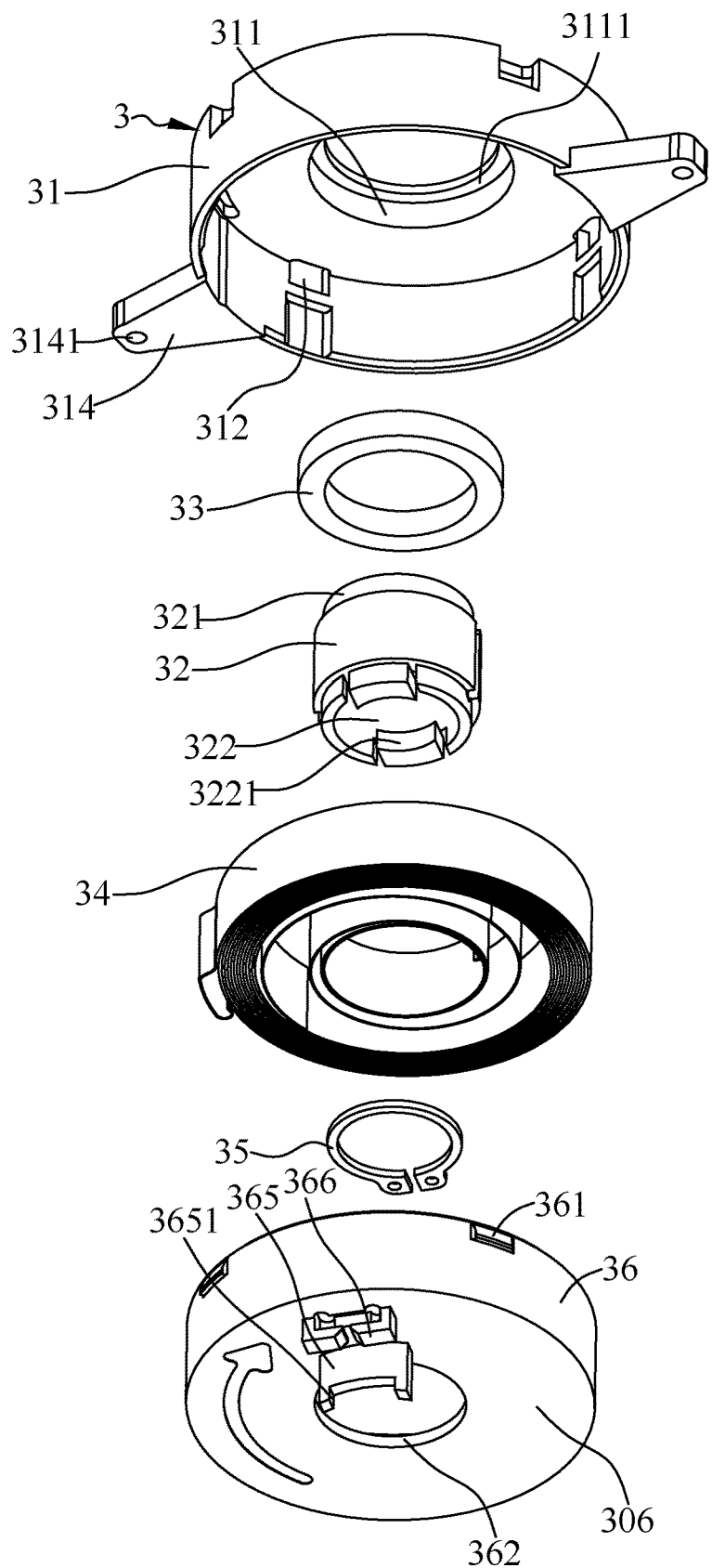
FIG. 8 is another exploded perspective view of the coil spring module of the anti-theft cable box of FIG. 7.
Figure 9:
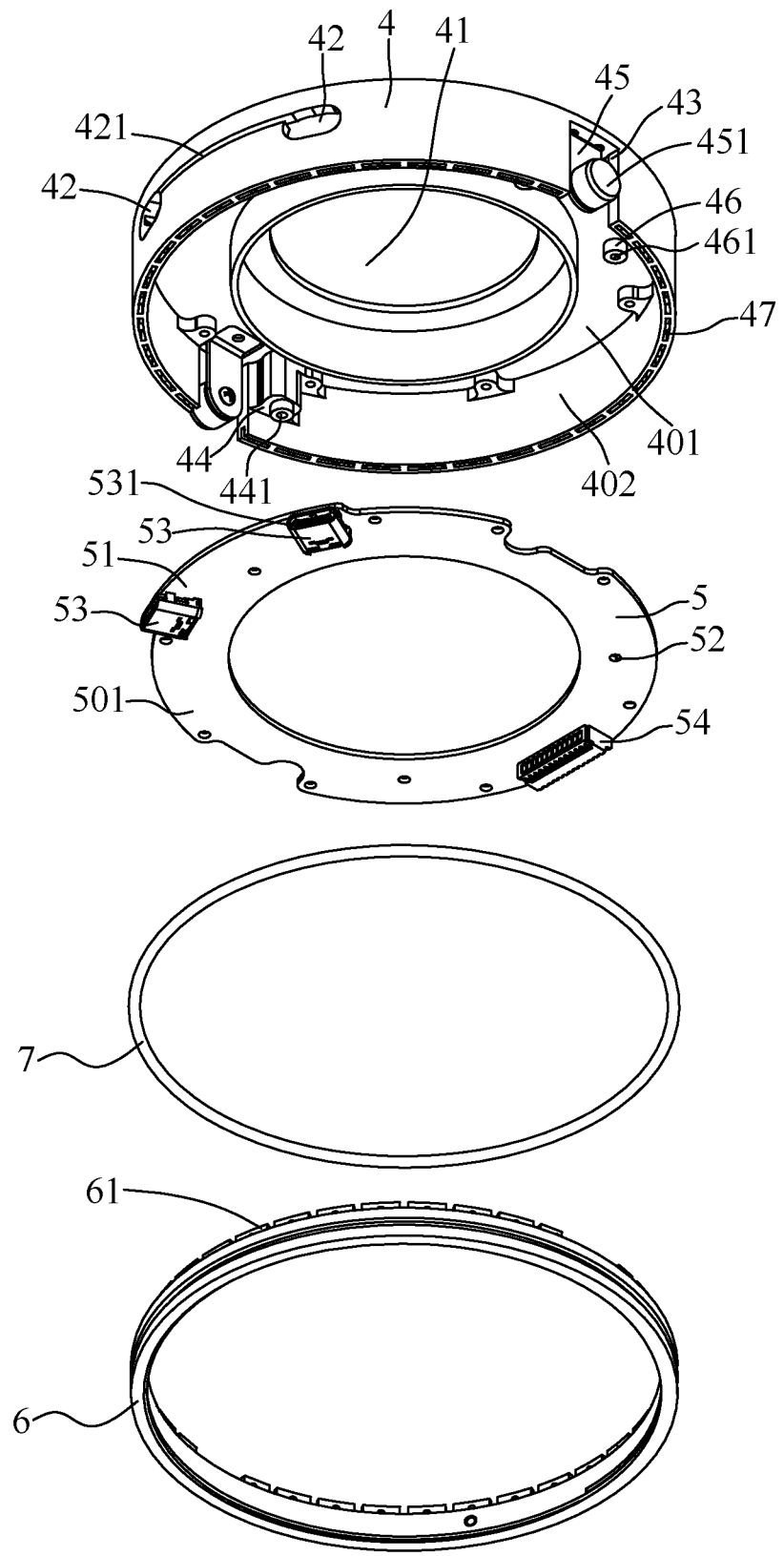
FIG. 9 is an exploded perspective view of an external connection module of the anti-theft cable box in accordance with the present invention.
Figure 10:
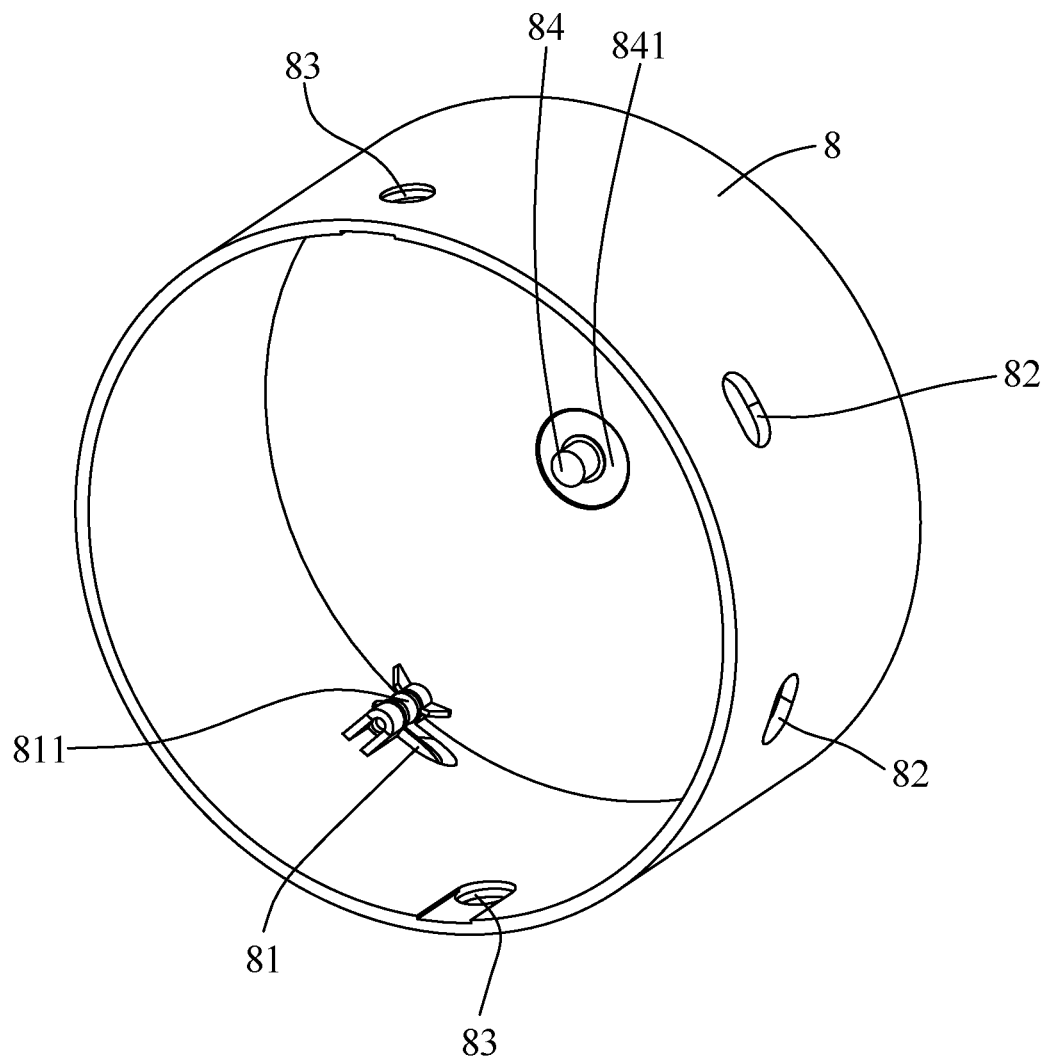
FIG. 10 is a perspective view of an outer casing of the anti-theft cable box in accordance with the present invention.

With reference to FIG. 2, FIG. 7 and FIG. 8, the coil spring module 3 is disposed in the external connection module 10. The coil spring module 3 is disposed under the conductive ring module 2 and is pivotally connected with the hollow second barrel portion 213 of the conductive ring module 2. The coil spring module 3 includes a hollow upper cover 31, a rotation shaft 32, a second bearing 33, a spring 34, a circlip 35 and a lower cover 36. A bottom of the hollow upper cover 31 is opened freely. A middle of the upper cover 31 opens a third connecting hole 311 vertically penetrating through the middle of the upper cover 31. An inner surface of a peripheral wall of the third connecting hole 311 protrudes inward to form a buckling portion 3111.

The upper cover 31 has a ring-shaped upper base sheet 301. A plurality of buckling holes 312 are opened in a periphery of the upper base sheet 301 of the upper cover 31 and are communicated with an inside of the hollow upper cover 31. A top of the upper cover 31 opens a restraining hole 313 communicated with the inside of the hollow upper cover 31. Two sides of a bottom of the upper base sheet 301 of the upper cover 31 protrude oppositely outward to form two convex blocks 314. The two convex blocks 314 open two lower fastening holes 3141 vertically penetrating through the two convex blocks 314. The rotation shaft 32 is installed in the third connecting hole 311 of the upper cover 31. An outer peripheral surface of a top portion of the rotation shaft 32 is recessed inward to form a limiting groove 321. A middle of the rotation shaft 32 opens a fourth connecting hole 322 penetrating through the middle of the rotation shaft 32 along an up-down direction.

At least one portion of a lower portion of an inner wall of the fourth connecting hole 322 protrudes inward to form at least one limiting block 3221 corresponding to at least one second notch 2132. When the rotation shaft 32 is assembled with the rotary plate 21, the hollow second barrel portion 213 passes through the fourth connecting hole 322, and the at least one limiting block 3221 is limited in the at least one second notch 2132. The second bearing 33 is mounted in the limiting groove 321 of the rotation shaft 32, and the second bearing 33 is mounted in the third connecting hole 311 and is attached to a bottom surface of the buckling portion 3111. The spring 34 is mounted around the rotation shaft 32. The circlip 35 is mounted in the accommodating slot 2131 of the hollow second barrel portion 213 and located at a bottom surface of the rotation shaft 32. Several portions of a peripheral surface of the lower cover 36 protrude outward to form a plurality of buckling blocks 361. Each buckling block 361 is corresponding to and buckled in one of the plurality of the buckling holes 312 of the upper cover 31.

A middle of the lower cover 36 opens a fifth connecting hole 362. The fifth connecting hole 362 is corresponding to and communicated with the fourth connecting hole 322. The lower cover 36 has a ring-shaped lower base sheet 306. A portion of a top surface of the lower base sheet 306 protrudes upward to form a restricting block 363 corresponding to the restraining hole 313 of the hollow upper cover 31. A periphery of the top surface of the lower base sheet 306 protrudes upward to form an arc-shaped restricting wall 307. The restricting block 363 is located between two sides of the restricting wall 307. The two sides of the restricting wall 307 are spaced from two sides of the restricting block 363 to form two interstices 364 of which each is located between one side of the restricting wall 307 and one side of the restricting block 363 adjacent to the one side of the restricting wall 307.

One end of the spring 34 passes through one interstice 364, and passes along and is attached to an outer surface of the restricting block 363, then enters the other interstice 364 and is attached to an inner surface of the restricting block 363, so that the one end of the spring 34 is wound around the restricting block 363, so that the one end of the spring 34 wraps the restricting block 363 to fasten the one end of the spring 34 to the restricting block 363, and accordingly the spring 34 has a resilience ability. A portion of a bottom surface of the lower base sheet 306 protrudes downward to form a propping portion 365 adjacent to the fifth connecting hole 362. Two sides of a bottom surface of the propping portion 365 protrude downward to form two insertion blocks 3651. Two portions of the bottom surface of the lower base sheet 306 protrude downward and then protrude towards each other to form two support blocks 366 located at an outer side of the propping portion 365. Tail ends of the two supporting blocks 366 are spaced from the bottom surface of the lower base sheet 306. The upper cover 31 is assembled with the lower cover 36 to form a receiving space 37 between the upper cover 31 and the lower cover 36. The rotation shaft 32, the second bearing 33, the spring 34 and the circlip 35 are received in the receiving space 37.

With reference to FIG. 2 to FIG. 9, the external connection module 10 is disposed under the conductive ring module 2, the coil spring module 3 is disposed in the external connection module 10. The external connection module 10 includes an outer shell 4, a second circuit board 5, a metal ring 6 and an annulus 7. The outer shell 4 surrounds downward the coil spring module 3. The outer shell 4 is assembled between the rotary plate 21 of the conductive ring module 2 and the upper cover 31 of the coil spring module 3. The outer shell 4 cover a top surface of the coil spring module 3. A middle of the outer shell 4 opens a sixth connecting hole 41 corresponding to and communicated with the fifth connecting hole 362. The outer shell 4 has a ring-shaped main plate 401. A periphery of the main plate 401 protrudes downward to form an annular enclosing wall 402. The enclosing wall 402 opens at least one first opening 42 penetrating through the enclosing wall 402 and communicated with an inside of the outer shell 4. In this embodiment, the enclosing wall 402 opens two first openings 42 penetrating through the enclosing wall 402 and communicated with the inside of the outer shell 4. The enclosing wall 402 opens a second opening 421 penetrating through the enclosing wall 402 and communicated with the inside of the outer shell 4. The second opening 421 is located between the two first openings 42 and communicated with the two first openings 42.

Two sides of a bottom of the outer shell 4 are recessed upward to form two third openings 43. Two sides of an inner surface of the enclosing wall 402 of the outer shell 4 protrude inward to form two first protruding portions 44. The two first protruding portions 44 open two upper fastening holes 441 corresponding to and communicated with the two lower fastening holes 3141 of the upper cover 31. Two fastening elements (not shown) pass through the two upper fastening holes 441 and the two lower fastening holes 3141, so that the upper cover 31 is fastened in the outer shell 4.

The inside of the outer shell 4 is equipped with two elastic pieces 45. The two elastic pieces 45 are disposed in the outer shell 4 and are exposed to the two third openings 43. The two elastic pieces 45 have two buttons 451 on outer surfaces of the two elastic pieces 45. The two buttons 451 are exposed to the two third openings 43. Several portions of a bottom surface of the main plate 401 of the outer shell 4 protrude downward to form a plurality of protruding pillars 46. A middle of each protruding pillar 46 is recessed upward to form an insertion hole 461. A bottom surface of the enclosing wall 402 of the outer shell 4 has a plurality of fastening fillisters 47 recessed upward.

The second circuit board 5 is of a ring shape. The second circuit board 5 is disposed in the outer shell 4 and located around the upper cover 31. The second circuit board 5 has an annular base ring 501. The second circuit board 5 has an insertion piece 51 protruded outward from one side of the base ring 501. The insertion piece 51 is inserted into the second opening 421. The second circuit board 5 opens a plurality of second fixing holes 52 vertically penetrating through the second circuit board 5. The plurality of the second fixing holes 52 are corresponding to and communicated with the insertion holes 461 of the outer shell 4. The plurality of fixing elements 203 pass through the plurality of the second fixing holes 52 and the plurality of the insertion holes 461, thereby the second circuit board 5 is fixed in the outer shell 4. The second circuit board 5 has at least one connection socket 53 corresponding to the at least one first opening 42 and exposed to the at least one first opening 42. In this embodiment, the second circuit board 5 has two connection sockets 53.

In this embodiment, the connection socket 53 is a USB type-c connector. One connection socket 53 is connected with an anti-theft system speaker (not shown), and the other connection socket 53 is connected to a power source (not shown). The second circuit board 5 further has a second connector 54. The second connector 54 is connected with the second wire assembly 2142. The second wire assembly 2142 passes through the at least one second notch 2132 of the hollow second barrel portion 213, and then passes through an interval between the two supporting blocks 366 and the bottom surface of the lower base sheet 306 along a middle of the bottom surface of the propping portion 365, and finally is connected with the second connector 54. The second connector 54 is connected to the first connector 221 of the first circuit board 22 by the first wire assembly 2141 and the second wire assembly 2142 of the conductive element 214, so that the first circuit board 22 and the second circuit board 5 are mutually connected in series.

The metal ring 6 is disposed to the bottom of the outer shell 4. A top portion of the metal ring 6 has a plurality of embedding blocks 61 corresponding to the plurality of the fastening fillisters 47. Each embedding block 61 is assembled in one of the plurality of the fastening fillisters 47.

The annulus 7 is disposed on the metal ring 6, a material of the annulus 7 is silicone.

With reference to FIG. 1 to FIG. 10, the outer casing 8 covers downward a top surface of the reel module 1, the conductive ring module 2, the coil spring module 3 and the external connection module 10. The outer casing 8 opens a first aperture 81. An inside of the outer casing 8 is equipped with a rotating shaft 811 disposed adjacent to the first aperture 81. A free end of the cable 13 projects out from the first aperture 81 of the outer casing 8. The cable 13 is pivoted to the rotating shaft 811. The rotating shaft 811 enables the cable 13 to be smoothly pulled out and returned. The outer casing 8 opens two second apertures 82. Each second aperture 82 is corresponding to one first opening 42 of the outer shell 4. Connection terminals 531 of the two connection sockets 53 are exposed from the two second apertures 82 of the outer casing 8. The outer casing 8 further opens two third apertures 83. Each third aperture 83 is corresponding to the button 451 of one elastic piece 45. Each button 451 is fastened in and exposed to one third aperture 83 of the outer casing 8.

The outer casing 8 covers a top surface of the outer shell 4. At the same time, the two buttons 451 of the outer shell 4 are located inside the outer casing 8. When the two buttons 451 are simultaneously aligned with the two third apertures 83, the two elastic pieces 45 exert resilience forces on the two buttons 451, so that each button 451 is fixed in and exposed in one third aperture 83, so the outer casing 8 is fixed in the outer shell 4. When the outer casing 8 is to be removed, the two buttons 451 are pressed inward in advance, so that the two buttons 451 are all inwardly exited from the two third apertures 83, and the outer casing 8 can be pulled upward. The above-mentioned operations make a replacement of the outer casing 8 become easier. An inner surface of a top of the outer casing 8 protrudes downward to form a fastening pillar 84. The fastening pillar 84 passes through the first bearing 1121 of the upper plate 11 and the first bearing 1121 abuts against an inner wall of the holding slot 112 of the upper plate 11. A middle of the inner surface of the top of the outer casing 8 is recessed inward to form a ring-shaped locating groove 841. A top of the first bearing 1121 is located in the locating groove 841. The first bearing 1121 provides a lubrication function for the reel module 1 at the time of the reel module 1 rotating to lower a friction force between the outer casing 8 and the upper plate 11 and make the upper plate 11 contact with the outer casing 8, so that the upper plate 11 is steadily fastened in the outer casing 8 for making the reel module 1 be able to rotate steadily and smoothly.

In use, when a user pulls the electronic device away from the display stand when the user experiences the electronic device on the display stand, the cable 13 connected to the electronic device is pulled outward, and the cable 13 drives the reel module 1 to rotate in a pulling direction of the cable 13. At the same time, because the buckling slice 2121 of the rotary plate 21 is fixed in the buckling slot 1116 of the upper plate 11, the buckling slice 2121 is driven to rotate with a rotation of the buckling slot 1116, so that the conductive ring module 2 is driven to rotate, at the moment, the rotation shaft 32 that is fastened to the hollow second barrel portion 213 rotates together with the hollow second barrel portion 213 to drive the coil spring module 3 to rotate. When the coil spring module 3 rotates, the spring 34 generates a resilient force, this resilient force will be without imposing a burden on the user when the user uses the electronic device in a hand-held manner. When the user puts the electronic device back on the display stand to end the experience, the resilient force makes the coil spring module 3 proceed rotating in a reverse direction so as to drive the conductive ring module 2 to rotate in the reverse direction, and finally the reel module 1 is driven to rotate in the reverse direction. In this way, the cable 13 is driven to be regularly and smoothly retracted into the cable groove 14 by a reverse rotation of the reel module 1 driven via the resilient force, so that the display stand is assisted for being quickly returned to an initial status.

As described above, the cable 13 of the anti-theft cable box 100 has a stretchable and retractable property and a function of winding up the cable 13 automatically by virtue of a cooperation of the reel module 1 and the coil spring module 3, when a salesperson displays the electronic product or a customer experiences the electronic product, the electronic product can be taken away from the display stand to display the electronic product more freely or experience the electronic product more freely by virtue of the stretchable property of the cable 13, and the cable 13 is returned to an original position by the salesperson or the customer without needing to arrange the retractable cable 13 by virtue of the function of winding up the cable 13, so time of arranging the cable 13 manually is saved. Furthermore, if somebody takes away the cable 13 on the display stand privately, the conductive ring module 2 set up in the anti-theft cable box 100 may detect and trigger the anti-theft system speaker to inform workers on-the-spot for reaching an anti-theft detection function. Thus, the anti-theft cable box 100 may not only help the salesperson display the electronic product, but also help the customer experience the electronic product so as to facilitate selling the electronic product and making the anti-theft cable box 100 have the anti-theft detection function to protect the electronic products during a period of the customer experiencing the electronic products. As a result, the display stand including the anti-theft cable box 100 can have a cable arrangement effect and an anti-theft effect.

What is claimed is:

1. An anti-theft cable box mounted on a display stand of electronic products, the anti-theft cable box comprising:
a reel module including an upper plate, a lower plate and a cable, a middle of the upper plate protruding downward to form a hollow first barrel portion, a portion of a bottom surface of the hollow first barrel portion being recessed upward to form a first notch, a middle of the hollow first barrel portion having an accommodating space penetrating through the bottom surface of the hollow first barrel portion, a middle of the lower plate opening a circular first connecting hole vertically penetrating through the middle of the lower plate, the hollow first barrel portion of the upper plate being fixed in the first connecting hole, a bottom surface of the upper plate being spaced from a top surface of the lower plate to form a cable groove between the bottom surface of the upper plate and the top surface of the lower plate, the cable being installed in the cable groove, one end of the cable being connected with a connection plug, the other end of the cable being externally connected to an electronic device to be displayed;
a conductive ring module disposed under the reel module, and the reel module being pivotally connected with the conductive ring module, the conductive ring module including a rotary plate and a first circuit board, a middle of the rotary plate opening a second connecting hole vertically penetrating through the middle of the rotary plate, and the second connecting hole being corresponding to and communicated with the first connecting hole, a top surface of a peripheral wall of the second connecting hole protruding upward to form a semicircular connection ring, a bottom surface of the peripheral wall of the second connecting hole protruding downward to form a hollow second barrel portion, a lower portion of a peripheral surface of the hollow second barrel portion being recessed inward to form an accommodating slot, the second connecting hole being equipped with a conductive element, an upper portion of the conductive element being mounted in the first connecting hole and being accommodated in the accommodating space of the upper plate, a top surface of the conductive element being connected with a first wire assembly, and a bottom surface of the conductive element being connected with a second wire assembly, the first circuit board being mounted on the rotary plate, the first circuit board being equipped with a first connector and a receptacle connector, the first wire assembly being connected with the first connector, the receptacle connector being connected with the connection plug;
a coil spring module disposed under the conductive ring module, and being pivotally connected with the hollow second barrel portion of the conductive ring module, the coil spring module including a hollow upper cover, a rotation shaft, a second bearing, a spring, a circlip and a lower cover, a middle of the upper cover opening a third connecting hole vertically penetrating through the middle of the upper cover, an inner surface of a peripheral wall of the third connecting hole protruding inward to form a buckling portion, a top of the hollow upper cover opening a restraining hole communicated with an inside of the hollow upper cover, the rotation shaft being installed in the hollow upper cover, an outer peripheral surface of a top portion of the rotation shaft being recessed inward to form a limiting groove, a middle of the rotation shaft opening a fourth connecting hole penetrating through the middle of the rotation shaft along an up-down direction, the hollow second barrel portion passing through the fourth connecting hole, the circlip being mounted in the accommodating slot of the hollow second barrel portion and located at a bottom surface of the rotation shaft, the second bearing being mounted in the limiting groove of the rotation shaft, and the second bearing being mounted in the third connecting hole and being attached to a bottom surface of the buckling portion, the spring being mounted around the rotation shaft, a middle of the lower cover opening a fifth connecting hole corresponding to and communicated with the fourth connecting hole, the lower cover having a ring-shaped lower base sheet, a portion of a top surface of the lower base sheet protruding upward to form a restricting block corresponding to the restraining hole of the hollow upper cover, a periphery of the top surface of the lower base sheet protruding upward to form an arc-shaped restricting wall, the restricting block being located between two sides of the restricting wall, the two sides of the restricting wall being spaced from two sides of the restricting block to form two interstices of which each is located between one side of the restricting wall and one side of the restricting block adjacent to the one side of the restricting wall, one end of the spring passing through one interstice, and passing along and being attached to an outer surface of the limiting portion, then entering the other interstice and being attached to an inner surface of the restricting block, so that the one end of the spring is wound around the restricting block, the one end of the spring wraps the restricting block to fasten the one end of the spring to the restricting block, and accordingly the spring has a resilience ability, the hollow upper cover being assemble with the lower cover to form a receiving space between the hollow upper cover and the lower cover, the rotation shaft, the second bearing, the spring and the circlip being received in the receiving space;

an external connection module disposed under the conductive ring module, the coil spring module being disposed in the external connection module, the external connection module including an outer shell, a second circuit board, a metal ring and an annulus, the outer shell surrounding downward the coil spring module, the outer shell being assembled between the rotary plate of the conductive ring module and the hollow upper cover of the coil spring module, the outer shell covering a top surface of the coil spring module, a middle of the outer shell opening a sixth connecting hole corresponding to and communicated with the fifth connecting hole, the outer shell having a ring-shaped main plate, a periphery of the main plate protruding downward to form an annular enclosing wall, the enclosing wall opening at least one first opening penetrating through the enclosing wall and communicated with an inside of the outer shell, the second circuit board being of a ring shape, the second circuit board being disposed in the outer shell and located around the hollow upper cover, the second circuit board having at least one connection socket corresponding to the at least one first opening and exposed to the at least one first opening, the second circuit board further having a second connector, the second connector being connected with the second wire assembly, the second connector being connected to the first connector of the first circuit board by the first wire assembly and the second wire assembly of the conductive element; and an outer casing covering downward a top surface of the reel module, the conductive ring module, the coil spring module and the external connection module, the outer casing opening a first aperture, an inside of the outer casing being equipped with a rotating shaft disposed adjacent to the first aperture, a free end of the cable projecting out from the first aperture of the outer casing, the outer casing opening two second apertures, each second aperture being corresponding to one first opening of the outer shell, connection terminals of the two connection sockets being exposed from the two second apertures of the outer casing.

2. The anti-theft cable box as claimed in claim 1, wherein a middle of a top surface of the upper plate is recessed downward to form a circular holding slot, the holding slot is equipped with a first bearing, an inner surface of a top of the outer casing protrudes downward to form a fastening pillar, the fastening pillar passes through the first bearing of the upper plate and the first bearing abuts against an inner wall of the holding slot of the upper plate, a middle of the inner surface of the top of the outer casing is recessed inward to form a ring-shaped locating groove, a top of the first bearing is located in the locating groove.

3. The anti-theft cable box as claimed in claim 1, wherein one side of the connection ring is opened freely to form a lacking groove, at least one side of a bottom surface of the hollow second barrel portion is recessed upward to form at least one second notch, two portions of a bottom surface of the lower base sheet protrude downward and then protrude towards each other to form two support blocks, a portion of the bottom surface of the lower base sheet protrudes downward to form a propping portion adjacent to the fifth connecting hole, the first wire assembly is connected with the first connector by virtue of passing through the lacking groove of the connection ring and passing through a place under the first clamping portion and the second clamping portion, the second wire assembly passes through the at least one second notch of the hollow second barrel portion, and then passes through an interval between the two supporting blocks and the bottom surface of the lower base sheet along a middle of a bottom surface of the propping portion, and finally is connected with the second connector.

4. The anti-theft cable box as claimed in claim 3, wherein at least one portion of a lower portion of an inner wall of the fourth connecting hole protrudes inward to form at least one limiting block corresponding to the at least one second notch, and the at least one limiting block is limited in the at least one second notch.

5. The anti-theft cable box as claimed in claim 1, wherein a periphery of the hollow first barrel portion has at least one fastening slot, each fastening slot is equipped with a pair of cable clips, each cable clip clamps the cable and each pair of the cable clips are fixed in one fastening slot.

6. The anti-theft cable box as claimed in claim 1, wherein one side of a bottom of an inner wall of the accommodating space of the upper plate is recessed upward to form a buckling slot, two opposite sides of a top surface of the connection ring extend upward to form two buckling slices, the two buckling slices are mounted in the buckling slot of the upper plate.

7. The anti-theft cable box as claimed in claim 1, wherein a middle of a top surface of the upper plate is recessed downward to form a circular holding slot, the upper plate opens at least one arc-shaped limiting slot adjacent to and spaced from the holding slot, at least one portion of a top surface of a peripheral wall of the first connecting hole protrudes upward to form at least one arc-shaped first blocking wall arched outward away from the first connecting hole, a top surface of the at least one first blocking wall protrudes upward to form an arc-shaped limiting portion, the limiting portion of the at least one first blocking wall is corresponding to and limited in the at least one limiting slot.

8. The anti-theft cable box as claimed in claim 1, wherein a periphery of the hollow first barrel portion has at least one locking hole communicated with the middle of the hollow first barrel portion, at least one portion of a bottom surface of a peripheral wall of the first connecting hole protrudes downward to form at least one second blocking wall, a bottom of the at least one second blocking wall protrudes inward to form a fastening block corresponding to and fastened in the at least one locking hole.

9. The anti-theft cable box as claimed in claim 1, wherein three portions of a bottom surface of a peripheral wall of the first connecting hole protrude downward to form three third blocking walls, three portions of the bottom surface of the peripheral wall of the first connecting hole protrude downward to form three second blocking walls, each third blocking wall is interposed between two adjacent second blocking walls, a bottom of each third blocking wall protrudes inward to form an arc-shaped abutting block arched outward away from the first connecting hole, an inner wall of the abutting block of each third blocking wall abuts against an outer surface of the hollow first barrel portion.

10. The anti-theft cable box as claimed in claim 9, wherein bottom surfaces of two abutting blocks of two third blocking walls are recessed upward to form two blocking slots, each buckling slot is equipped with a metal plate, at least one fastening tube is equipped with at least one magnet, the at least one magnet is corresponding to the metal plate, the magnet is able to attract the metal plate, so that the lower plate is fixed on the rotary plate.

11. The anti-theft cable box as claimed in claim 1, wherein several portions of an inner surface of the outer stopping wall and an outer surface of the inner stopping wall protrude into the accommodating groove to form a plurality of protruding blocks, each protruding block opens a lower fixing hole, the first circuit board has a plurality of location holes corresponding to and communicated with the plurality of the lower fixing holes of the plurality of the protruding blocks, a plurality of fixing elements pass through the plurality of the location holes and the plurality of the lower fixing holes corresponding to and communicated with the plurality of the location holes, so the first circuit board is fixed on the rotary plate.

12. The anti-theft cable box as claimed in claim 1, wherein a plurality of buckling holes are opened in a periphery of the upper base sheet of the hollow upper cover and are communicated with an inside of the hollow upper cover, several portions of a peripheral surface of the lower cover protrude outward to form a plurality of buckling blocks, each buckling block is corresponding to and buckled in one of the plurality of the buckling holes of the hollow upper cover.

13. The anti-theft cable box as claimed in claim 1, wherein the enclosing wall opens two first openings penetrating through the enclosing wall and communicated with the inside of the outer shell, the enclosing wall opens a second opening penetrating through the enclosing wall and communicated with the inside of the outer shell, the second opening is located between the two first openings and communicated with the two first openings, the second circuit board has an annular base ring, and an insertion piece protruded outward form one side of the base ring, the insertion piece is inserted into the second opening.

14. The anti-theft cable box as claimed in claim 1, wherein the external connection module further includes a metal ring and an annulus, the annulus is disposed on the metal ring, a bottom surface of the enclosing wall of the outer shell has a plurality of fastening fillisters recessed upward, the metal ring is disposed to a bottom of the outer shell, a top portion of the metal ring has a plurality of embedding blocks corresponding to the plurality of the fastening fillisters, each embedding block is assembled in one of the plurality of the fastening fillisters.

15. The anti-theft cable box as claimed in claim 1, wherein two sides of a bottom of the outer shell are recessed upward to form two third openings, an inside of the outer shell is equipped with two elastic pieces, the two elastic pieces are disposed in the outer shell and are exposed to the two third openings, the two elastic pieces have two buttons on outer surfaces of the two elastic pieces, the two buttons are exposed to the two third openings, the outer casing further opens two third apertures, each third aperture is corresponding to the button of one elastic piece, each button is fastened in and exposed to one third aperture of the outer casing.

16. An anti-theft cable box, comprising:
a reel module including an upper plate, a lower plate and a cable, a middle of the upper plate protruding downward to form a hollow first barrel portion, a portion of a bottom surface of the hollow first barrel portion being recessed upward to form a first notch, a middle of the hollow first barrel portion having an accommodating space penetrating through the bottom surface of the hollow first barrel portion, a middle of the lower plate opening a circular first connecting hole vertically penetrating through the middle of the lower plate, the hollow first barrel portion of the upper plate being fixed in the first connecting hole, a bottom surface of the upper plate being spaced from a top surface of the lower plate to form a cable groove between the bottom surface of the upper plate and the top surface of the lower plate, the cable being installed in the cable groove, one end of the cable being connected with a connection plug, the other end of the cable being externally connected to an electronic device to be displayed;
a conductive ring module disposed under the reel module, and the reel module being pivotally connected with the conductive ring module, the conductive ring module including a rotary plate and a first circuit board, a middle of the rotary plate opening a second connecting hole vertically penetrating through the middle of the rotary plate, and the second connecting hole being corresponding to and communicated with the first connecting hole, a top surface of a peripheral wall of the second connecting hole protruding upward to form a semicircular connection ring, a bottom surface of the peripheral wall of the second connecting hole protruding downward to form a hollow second barrel portion, a lower portion of a peripheral surface of the hollow second barrel portion being recessed inward to form an accommodating slot, the second connecting hole being equipped with a conductive element, an upper portion of the conductive element being mounted in the first connecting hole and being accommodated in the accommodating space of the upper plate, a top surface of the conductive element being connected with a first wire assembly, and a bottom surface of the conductive element being connected with a second wire assembly, the first circuit board being mounted on the rotary plate, the first circuit board being equipped with a first connector and a receptacle connector, the first wire assembly being connected with the first connector, the receptacle connector being connected with the connection plug;
a coil spring module disposed under the conductive ring module, and being pivotally connected with the hollow second barrel portion of the conductive ring module, the coil spring module including a hollow upper cover, a rotation shaft, a second bearing, a spring, a circlip and a lower cover, a middle of the upper cover opening a third connecting hole vertically penetrating through the middle of the upper cover, an inner surface of a peripheral wall of the third connecting hole protruding inward to form a buckling portion, a top of the hollow upper cover opening a restraining hole communicated with an inside of the hollow upper cover, the rotation shaft being installed in the hollow upper cover, an outer peripheral surface of a top portion of the rotation shaft being recessed inward to form a limiting groove, a middle of the rotation shaft opening a fourth connecting hole penetrating through the middle of the rotation shaft along an up-down direction, the hollow second barrel portion passing through the fourth connecting hole, the circlip being mounted in the accommodating slot of the hollow second barrel portion and located at a bottom surface of the rotation shaft, the second bearing being mounted in the limiting groove of the rotation shaft, and the second bearing being mounted in the third connecting hole and being attached to a bottom surface of the buckling portion, the spring being mounted around the rotation shaft, a middle of the lower cover opening a fifth connecting hole corresponding to and communicated with the fourth connecting hole, the lower cover having a ring-shaped lower base sheet, a portion of a top surface of the lower base sheet protruding upward to form a restricting block corresponding to the restraining hole of the hollow upper cover, a periphery of the top surface of the lower base sheet protruding upward to form an arc-shaped restricting wall, the restricting block being located between two sides of the restricting wall, the two sides of the restricting wall being spaced from two sides of the restricting block to form two interstices of which each is located between one side of the restricting wall and one side of the restricting block adjacent to the one side of the restricting wall, one end of the spring passing through one interstice, and passing along and being attached to an outer surface of the limiting portion, then entering the other interstice and being attached to an inner surface of the restricting block, so that the one end of the spring is wound around the restricting block, the one end of the spring wraps the restricting block to fasten the one end of the spring to the restricting block, and accordingly the spring has a resilience ability, the hollow upper cover being assemble with the lower cover to form a receiving space between the hollow upper cover and the lower cover, the rotation shaft, the second bearing, the spring and the circlip being received in the receiving space; and an external connection module disposed under the conductive ring module, the coil spring module being disposed in the external connection module, the external connection module including an outer shell, a second circuit board, a metal ring and an annulus, the outer shell surrounding downward the coil spring module, the outer shell being assembled between the rotary plate of the conductive ring module and the hollow upper cover of the coil spring module, the outer shell covering a top surface of the coil spring module, a middle of the outer shell opening a sixth connecting hole corresponding to and communicated with the fifth connecting hole, the outer shell having a ring-shaped main plate, a periphery of the main plate protruding downward to form an annular enclosing wall, the enclosing wall opening at least one first opening penetrating through the enclosing wall and communicated with an inside of the outer shell, the second circuit board being of a ring shape, the second circuit board being disposed in the outer shell and located around the hollow upper cover, the second circuit board having at least one connection socket corresponding to the at least one first opening and exposed to the at least one first opening, the second circuit board further having a second connector, the second connector being connected with the second wire assembly, the second connector being connected to the first connector of the first circuit board by the first wire assembly and the second wire assembly of the conductive element.

17. An anti-theft cable box adapted for being connected with an electronic device by a cable, the anti-theft cable box comprising:

a reel module including an upper plate, a lower plate and the cable, a middle of the upper plate protruding downward to form a hollow first barrel portion, a portion of a bottom surface of the hollow first barrel portion being recessed upward to form a first notch, a middle of the hollow first barrel portion having an accommodating space penetrating through the bottom surface of the hollow first barrel portion, a middle of the lower plate opening a circular first connecting hole vertically penetrating through the middle of the lower plate, the hollow first barrel portion of the upper plate being fixed in the first connecting hole, a bottom surface of the upper plate being spaced from a top surface of the lower plate to form a cable groove between the bottom surface of the upper plate and the top surface of the lower plate, the cable being installed in the cable groove, the cable being connected between the anti-theft cable box and the electronic device;

a conductive ring module disposed under the reel module, and the reel module being pivotally connected with the conductive ring module, the conductive ring module including a rotary plate and a first circuit board, a middle of the rotary plate opening a second connecting hole vertically penetrating through the middle of the rotary plate, and the second connecting hole being corresponding to and communicated with the first connecting hole, a top surface of a peripheral wall of the second connecting hole protruding upward to form a semicircular connection ring, a bottom surface of the peripheral wall of the second connecting hole protruding downward to form a hollow second barrel portion, a lower portion of a peripheral surface of the hollow second barrel portion being recessed inward to form an accommodating slot, the second connecting hole being equipped with a conductive element, an upper portion of the conductive element being mounted in the first connecting hole and being accommodated in the accommodating space of the upper plate, a top surface of the conductive element being connected with a first wire assembly, and a bottom surface of the conductive element being connected with a second wire assembly, the first circuit board being mounted on the rotary plate, the first circuit board being equipped with a first connector, the first wire assembly being connected with the first connector;

a coil spring module disposed under the conductive ring module, and being pivotally connected with the hollow second barrel portion of the conductive ring module, the coil spring module including a hollow upper cover, a rotation shaft, a second bearing, a spring, a circlip and a lower cover, a middle of the upper cover opening a third connecting hole vertically penetrating through the middle of the upper cover, an inner surface of a peripheral wall of the third connecting hole protruding inward to form a buckling portion, a top of the hollow upper cover opening a restraining hole communicated with an inside of the hollow upper cover, the rotation shaft being installed in the hollow upper cover, an outer peripheral surface of a top portion of the rotation shaft being recessed inward to form a limiting groove, a middle of the rotation shaft opening a fourth connecting hole penetrating through the middle of the rotation shaft along an up-down direction, the hollow second barrel portion passing through the fourth connecting hole, the circlip being mounted in the accommodating slot of the hollow second barrel portion and located at a bottom surface of the rotation shaft, the second bearing being mounted in the limiting groove of the rotation shaft, and the second bearing being mounted in the third connecting hole and being attached to a bottom surface of the buckling portion, the spring being mounted around the rotation shaft, a middle of the lower cover opening a fifth connecting hole corresponding to and communicated with the fourth connecting hole, the lower cover having a ring-shaped lower base sheet, a portion of a top surface of the lower base sheet protruding upward to form a restricting block corresponding to the restraining hole of the hollow upper cover, a periphery of the top surface of the lower base sheet protruding upward to form an arc-shaped restricting wall, the restricting block being located between two sides of the restricting wall, the two sides of the restricting wall being spaced from two sides of the restricting block to form two interstices of which each is located between one side of the restricting wall and one side of the restricting block adjacent to the one side of the restricting wall, one end of the spring passing through one interstice, and passing along and being attached to an outer surface of the limiting portion, then entering the other interstice and being attached to an inner surface of the restricting block, so that the one end of the spring is wound around the restricting block, the one end of the spring wraps the restricting block to fasten the one end of the spring to the restricting block, and accordingly the spring has a resilience ability, the hollow upper cover being assemble with the lower cover to form a receiving space between the hollow upper cover and the lower cover, the rotation shaft, the second bearing, the spring and the circlip being received in the receiving space; and an external connection module disposed under the conductive ring module, the coil spring module being disposed in the external connection module, the external connection module including an outer shell, a second circuit board, a metal ring and an annulus, the outer shell surrounding downward the coil spring module, the outer shell being assembled between the rotary plate of the conductive ring module and the hollow upper cover of the coil spring module, the outer shell covering a top surface of the coil spring module, a middle of the outer shell opening a sixth connecting hole corresponding to and communicated with the fifth connecting hole, the outer shell having a ring-shaped main plate, a periphery of the main plate protruding downward to form an annular enclosing wall, the enclosing wall opening at least one first opening penetrating through the enclosing wall and communicated with an inside of the outer shell, the second circuit board being of a ring shape, the second circuit board being disposed in the outer shell and located around the hollow upper cover, the second circuit board having at least one connection socket corresponding to the at least one first opening and exposed to the at least one first opening, the second circuit board further having a second connector, the second connector being connected with the second wire assembly, the second connector being connected to the first connector of the first circuit board by the first wire assembly and the second wire assembly of the conductive element.

* * * * *